United States Patent [19]

Nakane

[11] Patent Number: 4,735,890

[45] Date of Patent: Apr. 5, 1988

[54] PHOTOMASKS FOR PHOTOLITHOGRAPHIC FINE PATTERNING

[75] Inventor: Hisashi Nakane, Kawasaki, Japan

[73] Assignee: Tokyo Ohka Kogyo Kabushiki Kaisha, Kanagawa, Japan

[21] Appl. No.: 867,884

[22] Filed: May 16, 1986

Related U.S. Application Data

[60] Continuation of Ser. No. 691,721, Jan. 15, 1985, abandoned, which is a division of Ser. No. 532,247, Sep. 14, 1983, abandoned.

[30] Foreign Application Priority Data

Sep. 16, 1982 [JP] Japan .................. 57-159683

[51] Int. Cl.$^4$ ............................................. G03C 5/00
[52] U.S. Cl. ........................................ 430/311; 430/5; 430/321; 430/322; 430/327
[58] Field of Search .................. 430/5, 11, 18, 14, 321, 430/961, 311, 327, 322; 427/40, 164; 428/203, 209

[56] References Cited

U.S. PATENT DOCUMENTS

| | | | |
|---|---|---|---|
| 4,357,417 | 11/1982 | Bartko et al. | 430/323 |
| 4,396,641 | 8/1983 | Imada et al. | 427/41 |
| 4,424,089 | 1/1984 | Sullivan | 156/155 |
| 4,436,809 | 3/1984 | Akao et al. | 430/501 |
| 4,514,489 | 4/1985 | Garcia et al. | 430/327 |

FOREIGN PATENT DOCUMENTS

| | | | |
|---|---|---|---|
| 53-66376 | 6/1978 | Japan | 430/5 |
| 53-117973 | 10/1978 | Japan | 430/5 |
| 55-099932 | 7/1980 | Japan | |
| 55-121443 | 9/1980 | Japan | 430/5 |

OTHER PUBLICATIONS

Carter et al, "Protective Coatings for Masks", IBM TDB vol. 13, (10) Mar. 1971, p. 3193.

Primary Examiner—John E. Kittle
Assistant Examiner—José G. Dees
Attorney, Agent, or Firm—Armstrong, Nikaido, Marmelstein & Kubovcik

[57] ABSTRACT

A photomask, used for the photolithographic fine patterning of a photoresist film in the preparation of semiconductors, is provided with a thin film of a polymeric material having resilient elasticity to cover the patterned masking layer and the surface of the substrate plate altogether so that very intimate contact is obtained between the photomask and the photoresist film contributing to a great increase in the resolving power in addition to the advantages of decreased stain and scratch formation on the surface of the photomask resulting in an increased productivity of semiconductor devices.

18 Claims, 1 Drawing Sheet

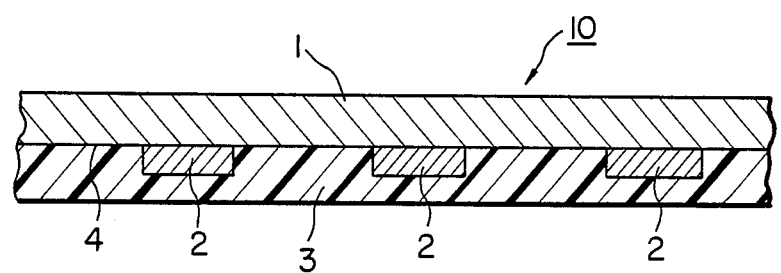

PHOTOMASKS FOR PHOTOLITHOGRAPHIC FINE PATTERNING

This application is a continuation of application Ser. No. 691,721, filed 1-15-85, abandoned, which is a division of application Ser. No. 532,247, filed 9-14-83, abandoned.

BACKGROUND OF THE INVENTION

The present invention relates to photolithographic fine patterning of a photoresist film in the preparation of, for example, semiconductor devices. More particularly, the invention relates to a photomask for photolithography which provides an improved high resolving power in the patterned photoresist film.

Most of the semiconductor devices are manufactured by the techniques of photolithographic fine patterning. The formation of a finely patterned layer of a photoresist material on a substrate is usually performed in the following manner. The surface of a substrate is first provided with a layer of a photoresist material which is then directly contacted with a photomask bearing a pattern of a masking material. The photoresist layer is irradiated through the masking material with actinic rays, such as ultraviolet light, so that the solubility behavior of the photoresist material becomes modified in the areas irradiated by the actinic rays and thereby forms a latent image which is a reproduction of the fine pattern of the photomask. When the solubility of the photoresist is increased by irradiation and becomes dissolvable by treatment with a developer liquid, the photoresist is called a positive-type. On the other hand, when the photoresist material is insolubilized by irradiation, so that the photoresist material on the unirradiated areas may be selectively dissolved away by the developer liquid, the photoresist material is called a negative-type. For either type, the developing treatment utilizes the solubility differences between the exposed and unexposed areas to form a latent image on the substrate.

In accordance with the rapidly increasing density of integration of the semiconductor devices such as LSIs and VLSIs in recent years, higher and higher resolving power is required in the patterning obtained in the above described manner reaching the so-called submicron region. As is known, the manufacturing process of most semiconductor devices, such as ICs, LSIs and the like, involves several and even up to 10 repeated photolithographic patterning steps. Each step is accompanied by a chemical etching procedure which causes an increasing surface ruggedness of the photoresist layer, so that the fidelity in the reproduction of the fine pattern of the photomask cannot be as high as desired on the photoresist layer. This gives rise to a limitation in the density of integration and decrease in the accuracy of working. Another factor for the decreased accuracy is the ruggedness on the surface of the photoresist layer which greatly disturbs the desirable direct and intimate contact between the photoresist layer and photomask laid thereon.

The above described problem in the fine patterning becomes more and more serious as the size of the substrate, i.e., the diameter of the wafer of silicon semiconductor, is increased.

The above described problem has been considered unavoidable insofar as photolithographic techniques are used for fine patterning in the manufacture of semiconductor devices.

SUMMARY OF THE INVENTION

It is therefore an object of the present invention to provide a novel photomask for photolithography which provides an extremely high resolving power in the fine patterning on a photoresist layer free from the above described problems and disadvantages in the prior art techniques of photolithography using conventional photomasks. This object of the invention can be accomplished by using a photomask according to the present invention provided with a thin layer of an elastically resilient polymeric material to cover the patterned masking material on a surface of a substrate plate.

In accordance with the present invention, we have discovered a novel and improved photomask for fine patterning in photolithography which comprises:
(a) a substrate plate made of a transparent material;
(b) a pattern-wise layer of an opaque masking material formed on one surface of the substrate plate; and
(c) a thin layer of an elastically resilient transparent polymeric material in covering relationship with the pattern-wise layer of the masking material and portions of the one surface of the substrate plate on which the pattern-wise layer of the masking material is formed.

BRIEF DESCRIPTION OF THE DRAWINGS

The FIGURE is a schematic cross sectional view of a photomask according to the invention.

DETAILED DESCRIPTION OF THE PREFERRED EMBODIMENTS

As is described above, the novel photomask 10 illustrated in the accompanying drawing by a schematic cross sectional view comprises three essential components which are substrate plate 1, masking layer or pattern-wise layer 2 of masking material and a thin layer 3 of an elastically resilient polymeric material covering pattern-wise layer 2 of the masking material and portions of the one surface of substrate 1 on which layer 2 is formed.

Substrate plate 1 should be made of a material having as high a transparency as possible for the transmission of ultraviolet light in order to obtain a high efficiency in the photolithographic exposure of the photoresist through the photomask 10. Conventional fused quartz glass and high-silica glass are satisfactory in most cases.

In contrast to substrate plate 1, masking material forming the pattern-wise layer 2 on the substrate plate 1 should be as opaque as possible against ultraviolet light. This is because masking layers 2, having a larger thickness, are disadvantageous from the standpoint of obtaining high resolving power in the fine patterning on the photoresist, although up to 50 nm of the thickness in the conventionally used masking layer may not be particularly detrimental for this purpose. The material for the masking layer 2 is not particularly critical provided that it is sufficiently opaque against ultraviolet light and has workability for the formation into a thin film on the substrate plate 1. Suitable masking materials are, for example, metallic chromium, chromium oxide, iron oxide and silver emulsions.

The elastically resilient polymeric material forming the thin layer 3 to cover the masking layer 2 and portions of the substrate plate 1, which is the most characteristic component of the novel photomask 10, should preferably satisfy the following requirements:

(1) The material should have a high optical transparency, in particular, for the transmission of ultraviolet light and the refractive index thereof should be as close as possible to that of substrate plate 1 or of the photoresist layer of the wafer (not shown).

(2) The material should have a sufficient resilient elasticity so that, when the novel photomask is directly contacted with a photoresist layer by, for example, vacuum suction or nitrogen gas blowing from the wafer chuck, no void space is left therebetween by compensating the step-wise difference in the surface levels.

(3) When the ultraviolet exposure of the photoresist through photomask 10 is complete and photomask 10 is to be taken up from the photoresist layer with which it has been in direct contact, photomask 10 should be readily separated from the photoresist layer without stickiness and the surface condition thereof should return completely to its initial state.

(4) The material should have good workability to ensure easy coating on the surface of the masking layer 2 and the polynumeric film 3 should have good peelability to ensure easy renewal, for example, when it is stained or damaged. Several examples of such a polymeric material, which satisfy all of the above mentioned requirements, include rubbery copolymers of ethylene and vinyl acetate, polyvinyl acetate, polyvinyl chloride, polyethylene, epichlorohydrin rubbers, polyisoprene, polyisobutylene, polychloroprene, chloinated rubbers, hydrochlorinated rubbers, cyclized rubbers, polyvinyl alkyl ethers, block copolymers of styrene and butadiene, gelatin, casein, cellulose, derivatives of cellulose, polymethyl isopropenyl ketone, polymethyl methacrylate and the like. These polymeric materials may be used either alone or in combinations of two kinds or more. When a polymeric material by itself has insufficient rubbery elasticity, it may be blended with a prepolymer having good rubbery elasticity.

A typical procedure for providing a thin film of the above named polymeric material on the surface of the masking material is as follows. For example, a block copolymer of styrene and butadiene is dissolved in xylene or other suitable solvent and the solution is filtered through a membrane filter having a pore diameter of 0.22 $\mu$m to remove any particulate matter in the solution. Thereafter, it is applied to the substrate surface on which a patterned layer of the masking material has been formed by use of a spinner followed by drying to give a thin film of the polymeric material having a thickness of about 3 to 5 $\mu$m. The thus formed thin film of the polymeric material still has stickiness so that the photomask bearing such a sticky film cannot be used as such because of possible adhesion to the photoresist layer with which it is to be contacted directly.

The surface stickiness can readily be removed to give a surface film of the polymer material having good peelability by exposing the sticky film to a plasma atmosphere of a gas of, for example, a fluorine-containing compound, such as carbon tetrafluoride and octafluoropropane, or a silicon compound, such as silane and silicon tetrafluoride, and thereby to effect a reaction of the polymeric film with the fluorine atoms or silicon atoms. This plasma treatment or other suitable post-treatments suggests that any polymeric material which does not satisfy one or more of the above mentioned requirements may be used as a material for the thin film on the novel photomask, provided that the polymeric material has adequate rubber elasticity.

The thickness of the thin film of the polymeric material 3 is preferably from about 3 to about 5 $\mu$m as measured from the surface of the substrate plate 1. The thickness as measured from the surface of the pattern-wise masking layer 2 is of course smaller than the above value by the thickness of the masking layer 2. When the thickness of the polymeric layer 3 is smaller than the lower limit of the above given range, the adverse effect caused by the ruggedness or difference in levels of the surfaces of the photoresist layer and/or the photomask composed of the substrate plate 1 and the pattern-wise masking layer 2 cannot be fully eliminated. On the other hand, a polymeric layer 3 having an excessively large thickness over the above given upper limit is disadvantageous from the standpoint of obtaining desired high resolving power due to the increase in the distance between the photoresist layer and the pattern-wise masking layer 2.

To summarize the great advantages obtained by use of our novel photomask, several problems and disadvantages in the prior art photolithographic techniques, which use a conventional photomask, can be completely overcome including (1) decrease in the production yield of semiconductor devices due to stain or contamination of the photoresist layer or the photomask; (2) damage to the expensive photomask by scratch formation; and (3) deficiency in the resolving power and dimensional accuracy in the fabrication of the devices due to the ruggedness on the wafer surface having been subjected to selective etching or the like processing.

The following examples are given to illustrate the present invention in further detail.

EXAMPLE 1

A rubbery copolymer of styrene and butadiene (Tufprene, a product by Asahi Chemical Industry Co., Ltd.) was dissolved in xylene in a concentration of 15% by weight. After filtration through a membrane filter having a pore diameter of 0.22 $\mu$m to remove particulate foreign matter in the solution, this rubber solution was applied onto the surface of a conventional chromium photomask by revolving in a spinner followed by drying on a hot plate kept at 130 C. to form a thin film of the polymeric material having a thickness of about 4 $\mu$m.

Thereafter, the photomask was exposed to a plasma atmosphere of carbon tetrafluoride gas for about 20 minutes in an apparatus for plasma treatment (OPM, manufactured by TOKYO OHKA KOGYO CO., LTD.) so as to remove the surface stickiness on the thin film of the polymeric material.

Separately, a semiconductor silicon wafer of 3 inches diameter, having been subjected to etching and diffusion treatment, was coated with a negative-type photoresist (OMR 85, a product of TOKYO OHKA KOGYO CO., LTD.) on the etched and diffusion-treated surface and the above prepared photomask was put on the wafer surface such that the polymeric film on the photomask and the photoresist layer on the wafer were in direct to ultraviolet light through the photomask for 2 seconds by use of a contact aligner (PLA-300, manufactured by CANON INC.) followed by development and rinsing treatment to give a patterned photoresist layer having a resolving power as small as 1.5 $\mu$m.

For comparison, the above described photolithographic process was repeated in substantially the same manner excepting the use of a photomask provided with no thin film of the polymeric material. The resultant resolving power of the patterned photoresist layer on the silicon wafer 2.0 μm.

This example shows that a significant improvement in resolving power can be obtained using our novel photomask over that of the prior art.

EXAMPLE 2

A photomask provided with a thin film of a polymeric material was prepared in substantially the same manner as in Example 1, except that the rubbery copolymer of styrene and butadiene in Example 1 was replaced with a copolymer of ethylene and vinyl acetate. Photolithographic patterning of the photoresist layer on a silicon wafer was undertaken by use of this photomask in substantially the same manner as in Example 1. In this case, a shortened exposure time of 1.5 seconds was sufficient and a resolving power of 1.5 μm was obtained in the patterned photoresist layer.

EXAMPLE 3

The same experimental procedure as in Example 2 was repeated except that the negative-type photoresist was replaced with a positive-type photoresist (OFPR 800, a product of TOKYO OHKA KOGYO CO., LTD.) to give a resolving power of 1.0 μm of the patterned photoresist layer.

What is claimed is:

1. An improved method of fine patterning in photolithography wherein the formation of a finely patterned layer of a photoresist material is formed on a substrate by providing a layer of photoresist material on the substrate, directly contacting the photoresist material with a photomask bearing a pattern of masking material, and irradiating the photoresist layer through the photomask, the improvement comprising substantially eliminating the gap space between the surface of the photoresist layer and the surface of the photomask when they are in direct contact, through the use of a photomask wherein;
   (a) a pattern-wise layer of the masking material is formed on one surface of a base plate which has a high transmission to ultraviolet light, thus covering a first portion of the base plate and leaving a second portion uncovered, said pattern-wise layer being substantially opaque to ultraviolet light,
   (b) providing a thin film of polymeric material in covering relationship with the pattern-wise layer and the uncovered second portion of said base plate, said film having a thickness of about 3-5 microns as measured from the surface of the base plate and being characterized as having resilient elasticity and;
   wherein the surface of the thin film of the polymeric material of the photomask has been subjected to exposure to a plasma atmosphere of a silicon-containing compound.

2. The improved method of fine patterning in photolithography of claim 1, wherein said base plate of the photomask is a member selected from the group consisting of fused quartz and high silica glass.

3. The improved method of fine patterning in photolithography of claim 2, wherein the polymeric material covering the pattern-wise layer and the uncovered second portion of the base plate is selected from the group consisting of a rubbery copolymer of ethylene and vinyl acetate, polyvinyl acetate, polyvinyl chloride, polyethylene, epichlorohydrin rubber, polyisoprene, polyisobutylene, polychloroprene, chlorinated rubber, hydrochlorinated rubber, cyclized rubber, polyvinyl alkyl ethers, block copolymer of styrene and butadiene, gelatin, casein, cellulose, derivatives of cellulose, polymethyl isopropenyl ketone and polymethyl methacrylate.

4. The improved method of fine patterning in photolithography of claim 3, wherein the polymeric material is a rubber copolymer of ethylene and vinyl acetate.

5. The improved method of fine patterning in photolithography of claim 3, wherein the polymeric material is a block copolymer of styrene and butadiene.

6. The improved method of fine patterning in photolithography of claim 2, wherein the silicon-containing compound is a silane.

7. The improved method of fine patterning in photolithography of claim 1, wherein the silicon-containing compound is silicon tetrafluoride.

8. The improved method of fine patterning in photolithography of claim 1, wherein the direct contact between the photoresist material and the photomask is achieved by a process selected from one of the group consisting of vacuum suction, and nitrogen gas flowing.

9. An improved method of fine patterning in photolithography wherein the formation of a finely patterned layer of a photoresist material is formed on a substrate by providing a layer of photoresist material on a substrate, said photoresist material having a rugged surface texture, directly contacting the photoresist material with a photomask bearing a pattern of masking material, and irradiating the photoresist layer through the photomask, the improvement comprising substantially eliminating the gap space between the surface of the photoresist layer and the surface of the photomask when they are in direct contact, through the use of a photomask wherein;
   (a) a pattern-wise layer of the masking material is formed on one surface of a base plate which has a high transmission to ultraviolet light, thus covering a first portion of the base plate and leaving a second portion uncovered, said pattern-wise layer being substantially opaque to ultraviolet light,
   (b) providing a thin film of polymeric material in covering relationship with the pattern-wise layer and the uncovered second portion of said substrate, said film having a thickness of about 3-5 microns as measured from the surface of the substrate and being characterized as having resilient elasticity and;
   wherein the surface of the thin film of the polymeric material of the photomask has been subjected to exposure to a plasma atmosphere of a silicon-containing compound.

10. The improved method of fine patterning in photolithography of claim 9, wherein said base plate of the photomask is a member selected from the group consisting of fused quartz and high silica glass.

11. The improved method of fine patterning in photolithography of claim 10, wherein the polymeric material covering the pattern-wise layer and the uncovered second portion of the base plate is selected from the group consisting of a rubbery copolymer of ethylene and vinyl acetate, polyvinyl acetate, polyvinyl chloride, polyethylene, epichlorohydrin rubber, polyisoprene, polyisobutylene, polychloroprene, chlorinated rubber, hydrochlorinated rubber, cyclized rubber, polyvinyl alkyl ethers, block copolymer of styrene and butadiene, gelatin, casein, cellulose, derivatives of cellulose, polymethyl isopropenyl ketone and polymethyl methacrylate.

12. The improved method of fine patterning in photolithography of claim 11, wherein the polymeric material is a rubber copolymer of ethylene and vinyl acetate.

13. The improved method of fine patterning in photolithography of claim 11, wherein the polymeric material is a block copolymer of styrene and butadiene.

14. The improved method of fine patterning in photolithography of claim 10, wherein the silicon-containing compound is a silane.

15. The improved method of fine patterning in photolithography of claim 10, wherein the silicon-containing compound is silicon tetrafluoride.

16. The improved of fine patterning in photolithography of claim 9, wherein the direct contact between the photoresist material and the photomask is achieved by a process selected from one of the group consisting of vacuum suction, and nitrogen gas flowing.

17. An improved method of fine patterning in photolithography wherein the formation of a finely patterned layer of a photoresist material is formed on a substrate by providing a layer of photoresist material on the substrate, directly contacting the photoresist material with a photomask bearing a pattern of masking material, and irradiating the photoresist layer through the photomask, the improvement comprising substantially eliminating the gap space between the surface of the photoresist layer and the surface of the photomask when they are in direct contact, through the use of a photomask wherein;
  (a) a pattern-wise layer of the masking material is formed on one surface of a base plate which has a high transmission to ultraviolet light, thus covering a first portion of the base plate and leaving a second portion uncovered, said pattern-wise layer being substantially opaque to ultraviolet light,
  (b) providing a thin film of a polymeric material in a covering relationship with the pattern-wise layer and the uncovered second portion of the said base plate, said film having a thickness of about 3–5 microns as measured from the surface of the base plate and being characterized as having resilient elasticity and;
  (c) wherein the surface of the thin film of the polymeric material of the photomask has been subjected to exposure to a plasma atmosphere of a gas of a material chosen from the group consisting of a silane and silicon tetrafluoride.

18. An improved method of fine patterning in photolithography wherein the formation of a finely patterned layer of a photoresist material is formed on a substrate by providing a layer of photoresist material on a substrate, said photoresist material having a rugged surface texture, directly contacting the photoresist material with a photomask bearing a pattern of masking material, and irradiating the photoresist layer through the photomask, the improvement comprising substantially eliminating the gap space between the surface of the photoresist layer and the surface of the photomask when they are in direct contact, through the use of a photomask wherein;
  (a) a pattern-wise layer of the masking maerial is formed on one surface of a base plate which has a high transmission to ultraviolet light, thus covering a first portion of the base plate and leaving a second portion uncovered, said pattern-wise layer being substantially opaque to ultraviolet light,
  (b) providing a thin film of a polymeric material in a covering relationship with the pattern-wise layer and the uncovered second portion of said base plate, said film having a thickness of about 3–5 microns as measured from the surface of the base plate and being characterized as having resilient elasticity and;
  wherein the surface of the thin film of the polymeric material of the photomask has been subjected to exposure to a plasma atmosphere of a gas of a material chosen from the group consisting of a silane and silicon tetrafluoride.

* * * * *